(12) United States Patent
Bringivijayaraghavan

(10) Patent No.: US 9,787,292 B2
(45) Date of Patent: Oct. 10, 2017

(54) HIGH PERFORMANCE MULTIPLEXED LATCHES

(71) Applicant: GLOBALFOUNDRIES INC., Grand Cayman (KY)

(72) Inventor: Venkatraghavan Bringivijayaraghavan, Bengaluru (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/003,598

(22) Filed: Jan. 21, 2016

(65) Prior Publication Data

US 2017/0214394 A1   Jul. 27, 2017

(51) Int. Cl.
  *H03K 3/037*  (2006.01)
  *H03K 17/00*  (2006.01)

(52) U.S. Cl.
  CPC .......... *H03K 3/037* (2013.01); *H03K 17/005* (2013.01)

(58) Field of Classification Search
  CPC ....... G11C 7/065; G11C 7/106; G11C 7/1087; H03K 3/3562; H03K 3/037
  USPC ....... 327/225, 199–203, 208, 215, 218, 403, 327/404
  See application file for complete search history.

(56) References Cited

U.S. PATENT DOCUMENTS

| | | | |
|---|---|---|---|
| 5,689,517 A * | 11/1997 | Ruparel | G01R 31/318541 307/418 |
| 6,378,008 B1 | 4/2002 | Gradinariu | |
| 6,906,558 B2 | 6/2005 | Lee et al. | |
| 7,149,129 B2 | 12/2006 | Vernenker et al. | |
| 8,536,898 B2 | 9/2013 | Rennie et al. | |
| 2008/0115025 A1* | 5/2008 | Frederick | G01R 31/318541 714/732 |
| 2015/0061740 A1* | 3/2015 | Balasubramanian | H03K 3/35625 327/202 |

\* cited by examiner

*Primary Examiner* — Thomas Skibinski
(74) *Attorney, Agent, or Firm* — Anthony Canale; Andrew M. Caleron; Roberts Mlotkowski Safran Cole & Calderon, P.C.

(57) ABSTRACT

The present disclosure relates to latch structures and, more particularly, to high performance multiplexed latches and methods of use. The multiplexed latch includes: a first latch structured to receive a data signal D0 and comprising a plurality of inverters which receive a respective input clock signal; and a second latch signal structured to receive a data signal D1 and comprising a plurality of inverters which receive a respective input clock signal.

18 Claims, 2 Drawing Sheets

D0, D1 – Data Inputs
CLK0, CLK0N – Clock, ClockN for Mux SEL=0
CLK1, CLK1N – Clock, ClockN for Mux SEL=1
Q – Mux Output

HIGH PERFORMANCE MULTIPLEXED LATCHES

FIELD OF THE INVENTION

The present disclosure relates to latch structures and, more particularly, to high performance multiplexed latches and methods of use.

BACKGROUND

In a memory (e.g., an embedded memory) where output data is not registered, the last stage in an output data path is typically a column data multiplexer. The multiplexer selects from among a number of column data signals based on the column address. One potential drawback with the column addresses, which are the control signals to the column data multiplexer, is that the column addresses could arrive at the column data multiplexer before the column data signals. This may occur because the column data signals, which travel through the memory core, may have a slower path relative to the column addresses. Consequently, this may result in a glitch on the output data signal due to the column data multiplexer switching from one column to a second column before new valid output data arrives at the second column. Therefore, for a brief period, old invalid output data is read out from the second column.

A conventional approach to this problem is to delay the column address to the column data multiplexer so that the column addresses arrive at the column data multiplexer after the valid output data from the memory core. For example, one approach is to insert a delay (e.g., a delay chain) in the column address path so that the column addresses arrive at the column data multiplexer after the output data. However, it may be difficult to match the output data path with the column address path.

As another example, a second approach is to provide a data path circuit (e.g., a dummy data path) to generate the column address signals to match the column address delay and the output data delay to the column data multiplexer. However, this approach may add significantly to die area overhead and design complexity. As a result, there is a need for improved memory techniques for providing the output data.

SUMMARY

In an aspect of the disclosure, a multiplexed latch comprises: a first latch structured to receive a data signal D0 and comprising a plurality of inverters which receive a respective input clock signal; and a second latch structured to receive a data signal D1 and comprising a plurality of inverters which receive a respective input clock signal.

In an aspect of the disclosure, a multiplexed latch comprises: a first latch comprising: a first inverter which is structured to receive a data signal D0 and an input clock signal CLK0; a driving inverter in series with the first inverter and which is structured to receive an input clock signal CLK1N; a feedback inverter which is parallel to the driving inverter and which is structured to receive an input clock signal CLK0N; and a second latch comprising: a first inverter which is structured to receive a data signal D1 and an input clock signal CLK1; a driving inverter in series with the first inverter and which is structured to receive an input clock signal CLK0N; and a feedback inverter which is parallel to the driving inverter and which is structured to receive an input clock signal CLK1N.

In an aspect of the disclosure, a method comprises enabling an input signal into a first inverter of a first latch to drive output data through a driving inverter of the first latch while turning of a feedback inverter of the first latch and isolating a second latch.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to latch structures and, more particularly, to high performance multiplexed latches and methods of use. More specifically, the present disclosure relates to multiplexed latches for read data paths of an SRAM cell. Advantageously, the multiplexed latch will:

(i) eliminate the influence of decode addresses (DA) on output data (Q) and thereby enhance memory performance;

(ii) eliminate the need to latch the AD address twice for reads;

(iii) integrate a sense amplifier and multiplexer;

(iv) prevent output glitches in case the AD toggles sooner than data arrival (compared to mux operations);

(v) provide faster access time (compared to conventional latch structures);

(vi) enable high frequency operation; and (vii) allow all decoding to be done at the Bitswitch level via programming for all decodes.

Figure 1:
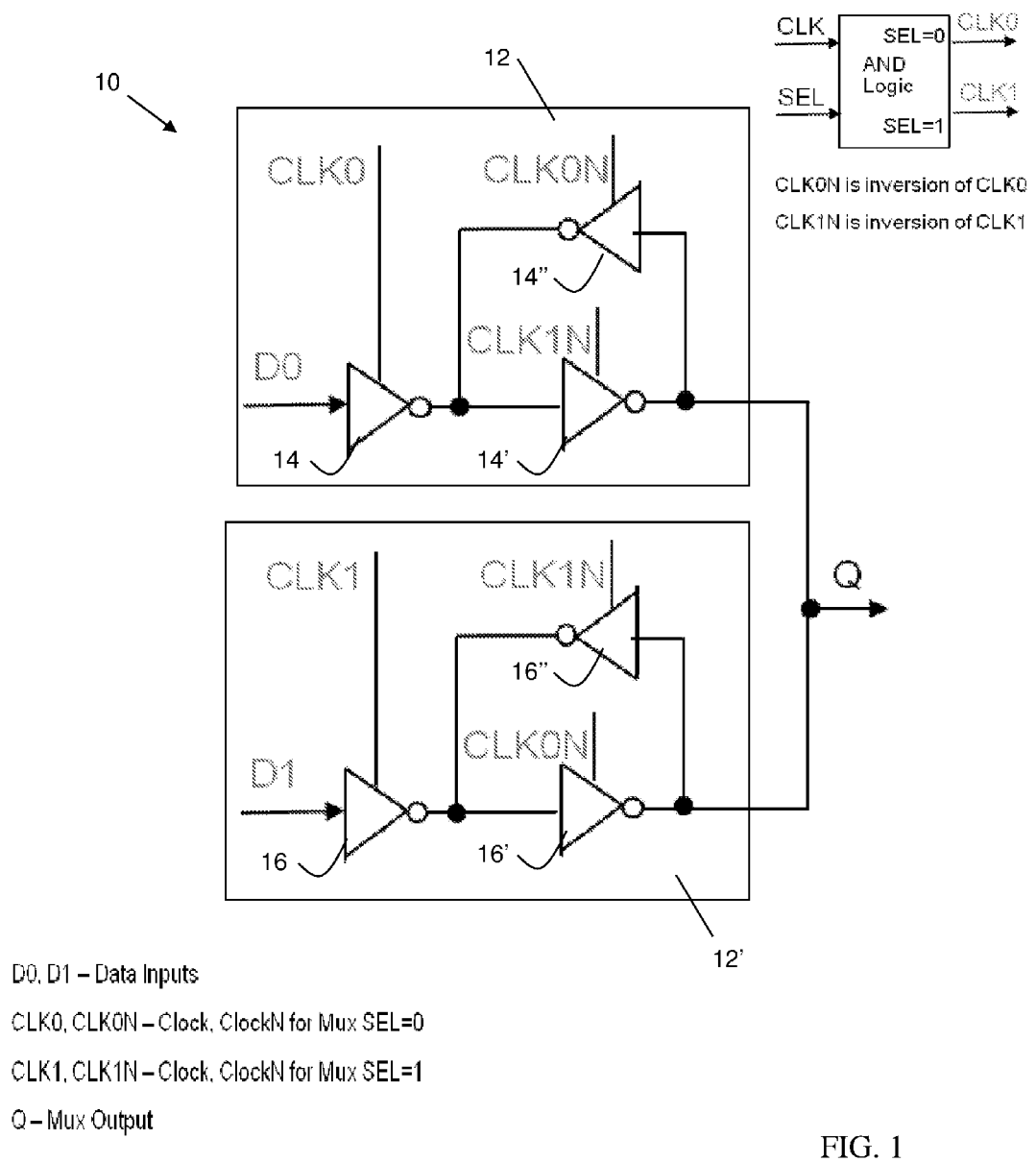
FIG. 1 shows a schematic diagram of a high performance multiplexed latch in accordance with aspects of the present disclosure.

FIG. 1 show a schematic diagram of a high performance multiplexed latch in accordance with aspects of the present disclosure. In operation, the multiplexed latch 10 is provided for a read data path in SRAM cells, which eliminates the need for a multiplexer. By eliminating the need of a multiplexer, the present structure avoids many known issues such as, for example, needing either one of the mux control signals active all the time or contention between muxes during active and inactive states of Sense Amplifier Enable clock signals.

In embodiments, the multiplexed latch 10 includes a first latch structure 12 in parallel with a second latch structure 12'. The first latch structure 12 and the second latch structure 12' each include a respective data input signal D0, D1, and a plurality of inverters. As should be understood by those of skill in the art, the inverters have only one input and are logically designed to reverse a logic state. Clock signals CLK0 and CLK1 are used to enable the respective latch structures 12, 12', and can be selected using AND gate logic. For example, SEL=1, CLK1 will be high; whereas, SEL=0, CLK0 will be high.

In embodiments, the first latch structure 12 includes a first inverter 14 in series with a second inverter 14' (e.g., driving inverter). A feedback inverter 14" is provided in parallel with the second inverter 14'. The data input signal D0 is gated by the inverter 14 based on a clock signal CLK0, which is a clock signal that enables multiplexing of the latch 12. Clock signals CLK0N and CLK1N are input into respective inverters 14" and 14'. Clock signal CLK0N is an inversion of CLK0 and clock signal CLK1N is an inversion of CLK1.

Similarly, the second latch structure 12' includes a first inverter 16 in series with a second inverter 16' (driving inverter). A feedback inverter 16" is provided in parallel with the second inverter 16'. The data input signal D1 is gated by the inverter 16 based on a clock signal CLK1, which is a clock signal that enables multiplexing of the latch 12'. Clock signals CLK0N and CLK1N are inputs to respective inverters 16' and 16".

In operation, selecting data input signal D0, when CLK0 goes high, CLK0N will go low and turn off latch 12'. That is, latch 12' will be isolated; whereas, the latch 12 will drive the output data Q. More specifically, when CLK0 is high, CLK0N will go low hence turning off inverter 16' of latch 12' and feedback inverter 14" of latch 12. In this way, latch 12' is isolated and output data Q will be driven primarily through inverter 14' of latch 12, e.g., since CLK1N will be high allowing inverter 14' of latch 12 to be the primary driver of output Q. In contrast, when CLK0 is low, both of the latches 12, 12' will drive output Q. This is because CLK0N will drive the feedback inverter 14" of latch 12 on which, in turn, will drive inverter 14' of latch 12 on, driving the output data Q. Accordingly, when the clock CLK0 is turned off, in instance of data input signal D0, the feedback inverter 14" will be driving output Q. And, as should be understood by those of skill in the art, when both CLK0N and CLK1N go high, there will be data retention and output Q is thus driven through both of the latches 12, 12'.

In further operation, selecting data input signal D1, when CLK1 goes high, CLK1N will go low turning off latch 12. This will isolate the latch 12 and will allow the latch 12' to drive output Q. More specifically, when CLK1 is high, CLK1N will go low hence turning off inverter 14' of latch 12 and feedback inverter 16" of latch 12'. In this way, latch 12 is isolated and output data Q will be driven only through inverter 16' of latch 12'. In contrast, when CLK1 is low, both of the latches 12, 12' will drive the output Q. This is because CLK1N will drive the feedback inverter 16" of latch 12' on which, in turn, will drive inverter 16' of latch 12' on, driving the output data Q through the inverter 16'. Accordingly, when the clock CLK1 is turned off, in instance of data input signal D1, the feedback inverters 16" will be driving output Q. And, as should be understood by those of skill in the art, when both CLK0N and CLK1N go high, there will be data retention and output Q is thus driven through both of the latches 12, 12'.

Figure 2:
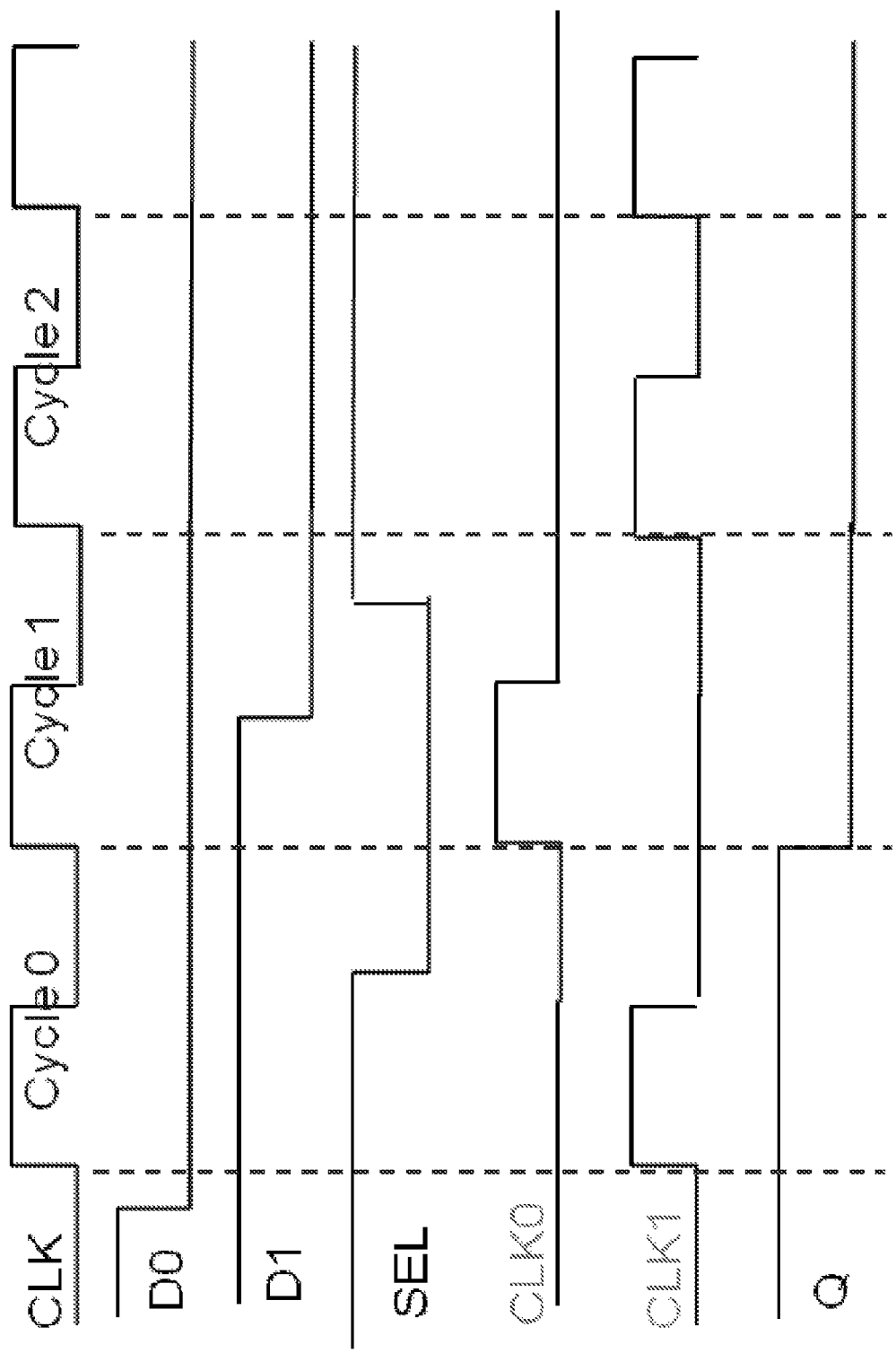
FIG. 2 is a timing diagram of the signals shown being processed by the structure in FIG. 1.

FIG. 2 is a timing diagram of the signals shown being processed by the structure in FIG. 1. More specifically, the timing diagram shows that when SEL signal is high, data input signal D0 is off and data input signal D1 is enabled (e.g., on). At this stage, CLK1 is high and the output data Q is driven as shown in cycle 0. In contrast, when the SEL signal is turned off (not enabled) during cycle 0, the CLK0 will go high immediately in cycle 1, input signal D1 is off and data input signal D0 is enabled (e.g., on) and, output data Q will driven starting at the beginning of cycle 1. In cycle 1, even though there may be a delay in arrival of data input signal D0 vs. CLK0 transition, there will not be any glitch as both latches store the pervious cycle data D1 information. Thus, the structure 10 prevents any glitch in the data output Q and performance in a memory cell is increased.

Accordingly, by implementing the structure 10 described herein, the proper state will always be driven to output Q, e.g., in the SRAM data path. The structure 10 will thus enhance performance of a memory, e.g., SRAM. Moreover, by implementing this structure 10, the implementation of driving the output Q becomes simple as the control signals for a sense amplifier, latch and multiplexer can now be the same, which, by having a same control signal, performance is enhanced (e.g., there is no output glitch or data delay).

In addition, compared to a conventional latch and multiplexer configuration, the output remains driven all the time even when both the Sense Amplifier Enable clock signals (CLK0, CLK1 are low (in comparison to a typical multiplexer (mux) in which either one of the mux control signals need to be active all the time). Moreover, by implementing the structure 10 described herein, there is no contention between the muxes during active and inactive states of Sense Amplifier Enable clock signals. Also, integrating the sense amplifier, latching and multiplexing operation eliminates the need for a standalone multiplexor.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A multiplexed latch comprising:
    a first latch structured to receive a data signal D0 and comprising a plurality of inverters which receive a respective input clock signal; and
    a second latch structured to receive a data signal D1 and comprising a plurality of inverters which receive a respective input clock signal,
    wherein the plurality of inverters of the second latch comprises a feedback inverter in parallel with a driving inverter, and a first inverter in series with the driving inverter, and
    in the second latch:
        an input clock signal CLK1 is an input to the first inverter;
        an input clock signal CLK1N is an input to the feedback inverter; and
        an input clock signal CLK0N is an input to the driving inverter.

2. The multiplexed latch of claim 1, wherein the plurality of input clock signals for the first latch and the second latch comprise three clock signals for inputting into respective inverters for each of the first latch and the second latch.

3. The multiplexed latch of claim 2, wherein:
the plurality of input clock signals for the first latch comprises CLK0, CLK0N and CLK1N.

4. The multiplexed latch of claim 3, wherein the input clock signal CLK0N is an inverted signal of the input clock signal CLK0 and the input clock signal CLK1N is an inverted signal of the input clock signal CLK1.

5. The multiplexed latch of claim 4, wherein the plurality of inverters of the first latch comprise a feedback inverter in parallel with a driving inverter, and a first inverter in series with the driving inverter.

6. The multiplexed latch of claim 5, wherein:
in the first latch:
the input clock signal CLK0 is an input to the first inverter;
the input clock signal CLK0N is an input to the feedback inverter; and
the input clock signal CLK1N is an input to the driving inverter.

7. The multiplexed latch of claim 5, wherein, when the input clock signal CLK0 goes high the data signal D0 is enabled to pass through the first inverter of the first latch, the input clock signal CLK0N goes low and isolates the second latch and the first latch drives output data Q.

8. The multiplexed latch of claim 5, wherein, when the input clock signal CLK1 goes high the data signal D0 is enabled to pass through the first inverter of the second latch, the input clock signal CLK1N goes low and isolates the first latch and the second latch drives output data Q.

9. A multiplexed latch comprising:
a first latch comprising:
a first inverter which is structured to receive a data signal D0 and an input clock signal CLK0;
a driving inverter in series with the first inverter and which is structured to receive an input clock signal CLK1N;
a feedback inverter which is parallel to the driving inverter and which is structured to receive an input clock signal CLK0N; and
a second latch comprising:
a first inverter which is structured to receive a data signal D1 and an input clock signal CLK1;
a driving inverter in series with the first inverter and which is structured to receive the input clock signal CLK0N; and
a feedback inverter which is parallel to the driving inverter and which is structured to receive the input clock signal CLK1N.

10. The multiplexed latch of claim 9, wherein the input clock signal CLK0N is an inverted signal of the input clock signal CLK0 and the input clock signal CLK1N is an inverted signal of the input clock signal CLK1.

11. The multiplexed latch of claim 10, wherein, when the input clock signal CLK0 goes high and the data signal D0 is enabled, the input clock signal CLK0N goes low and isolates the second latch, and the first latch drives output data Q.

12. The multiplexed latch of claim 11, wherein, when the input clock signal CLK0 goes high, the driving inverter of the second latch is low, the feedback inverter of the first latch is low and the driving inverter of the first latch is high, driving the output data Q.

13. The multiplexed latch of claim 10, wherein, when the input clock signal CLK0 goes low and the data signal D0 is enabled, the driving inverter of the second latch is high, the feedback inverter of the first latch is high and the driving inverter of the first latch is low, and the output data Q is driven through both the first latch and the second latch.

14. The multiplexed latch of claim 10, wherein, when the input clock signal CLK1 goes high and the data signal D1 is enabled, the input clock signal CLK1N goes low and isolates the first latch, and the second latch drives output data Q.

15. The multiplexed latch of claim 14, wherein, when the input clock signal CLK1 goes high and the data signal D1 is enabled, the driving inverter of the first latch is low, the feedback inverter of the second latch is low and the driving inverter of the second latch is high, driving the output data Q.

16. The multiplexed latch of claim 10, wherein, when the input clock signal CLK1 goes low and the data signal D1 is enabled, the driving inverter of the first latch is high, the feedback inverter of the second latch is high and the driving inverter of the second latch is low, and the output data Q is driven through both the first latch and the second latch.

17. The multiplexed latch of claim 10, wherein the input clock signal CLK1N and the input clock signal CLK0N are enabled by a SEL signal.

18. A method comprising:
enabling an input signal into a first inverter of a first latch to drive output data through a driving inverter of the first latch while turning off a feedback inverter of the first latch and isolating a second latch;
enabling an input signal into a first inverter of the second latch to drive output data through a driving inverter of the second latch while turning off a feedback inverter of the second latch and isolating the first latch, wherein:
the first inverter of the first latch receives a data signal D0 and an input clock signal CLK0;
the driving inverter of the first latch receives an input clock signal CLK1N,
the feedback inverter of the first latch receives an input clock signal CLK0N;
the first inverter of the second latch receives a data signal D1 and an input clock signal CLK1;
the driving inverter of the second latch receives the input clock signal CLK0N; and
the feedback inverter of the second latch receive the input clock signal CLK1N.

* * * * *